United States Patent [19]

Buchheit

[11] 4,106,869

[45] Aug. 15, 1978

[54] DISTANCE COMPENSATED ELECTROSTATIC VOLTMETER

[75] Inventor: Robert F. Buchheit, Pittsford, N.Y.

[73] Assignee: Xerox Corporation, Stamford, Conn.

[21] Appl. No.: 744,910

[22] Filed: Nov. 26, 1976

[51] Int. Cl.² .................... G03G 21/00; G01R 19/00
[52] U.S. Cl. ..................................... 355/3 R; 324/32; 324/72
[58] Field of Search ............... 323/21; 324/32, 72, 324/72.5, 109, 118, 123 R; 355/3 R, 14

[56] References Cited

U.S. PATENT DOCUMENTS

| | | | |
|---|---|---|---|
| 3,404,341 | 10/1968 | Young | 324/72 X |
| 3,604,925 | 9/1971 | Snelling et al. | 323/21 X |
| 3,667,036 | 5/1972 | Seachman | 324/123 R |
| 3,851,247 | 11/1974 | Vosteen et al. | 324/72 |

Primary Examiner—A. D. Pellinen

[57] ABSTRACT

A d.c. type electrostatic voltmeter for use in measuring voltage potentials on a surface such as the photoconductive surface of an electrostatic type reproduction machine. Circuitry is provided to automatically compensate for variations the electrometer probe-to-surface spacing, the circuitry including an a.c. signal source, a circuit to superimpose an a.c. signal from the source through the input and onto the d.c. signal output of the electrometer probe, an amplitude detector to detect changes in the a.c. signal source amplitude resulting from changes in the probe-to-surface spacing, a feedback control responsive to such amplitude changes to adjust the amplitude of the combined d.c./a.c. signal to maintain a prescribed a.c. amplitude, and a filter to thereafter remove the a.c. signal leaving the corrected d.c. signal.

6 Claims, 4 Drawing Figures

DISTANCE COMPENSATED ELECTROSTATIC VOLTMETER

This invention relates to electrostatic voltmeters and more particularly to an improved d.c. type electrostatic voltmeter.

Electrostatic voltmeters, commonly termed electrometers, are useful tools in their ability to accurately measure charge potentials on a surface, such as the photoconductive surface of an electrostatic type reproduction machine or copier without touching and perhaps scratching the photoreceptor surface. One type of electrometer known as a d.c. electrometer produces a constant signal output, i.e. a direct current signal, representative of the charge on the surface being viewed. D.C. type electrometers, however, are found to have a high probe-to-surface spacing sensitivity. In many cases, the sensitivity is so pronounced that even the slightest change in the space between the probe and the surface being measured introduces an appreciable error into the electrometer readings.

It is therefore a principal object of the present invention to provide a new and improved d.c. type electrometer.

It is a further object of the present invention to provide an improved d.c. electrometer having reduced spacing sensitivity.

It is a further object of the present invention to provide a d.c. type electrometer incorporating means to automatically neutralize changes in spacing between the electrometer probe and the surface being measured.

It is an object of the present invention to provide a d.c. electrometer for use with electrostatic type copiers incorporating a feed back circuit in the electrometer to neutralize spacing sensitivity.

It is an object of the present invention to provide an improved d.c. type electrostatic voltmeter for use with electrostatic type copying and reproduction machines.

This invention relates to an electrostatic voltmeter for measuring the potential of a surface, the combination of: a probe; a housing for the probe; support means for supporting the probe and housing in spaced relationship with the surface; means for generating an a.c. bias signal; means for applying the a.c. bias signal to the probe housing and for combining the a.c. bias signal with the probe output signal to produce a combined a.c./d.c. signal; means for generating an a.c. reference signal; and means for regulating the amplitude of the combined a.c./d.c. signal in response to changes in amplitude between the a.c. component of the combined a.c./d.c. signal and the a.c. reference signal to maintain a preset relationship between the amplitudes of the a.c. signals whereby changes in spacing between the probe and the surface are compensated for.

Other objects and advantages will be apparent from the ensuing description and drawings in which.

Figure 1:
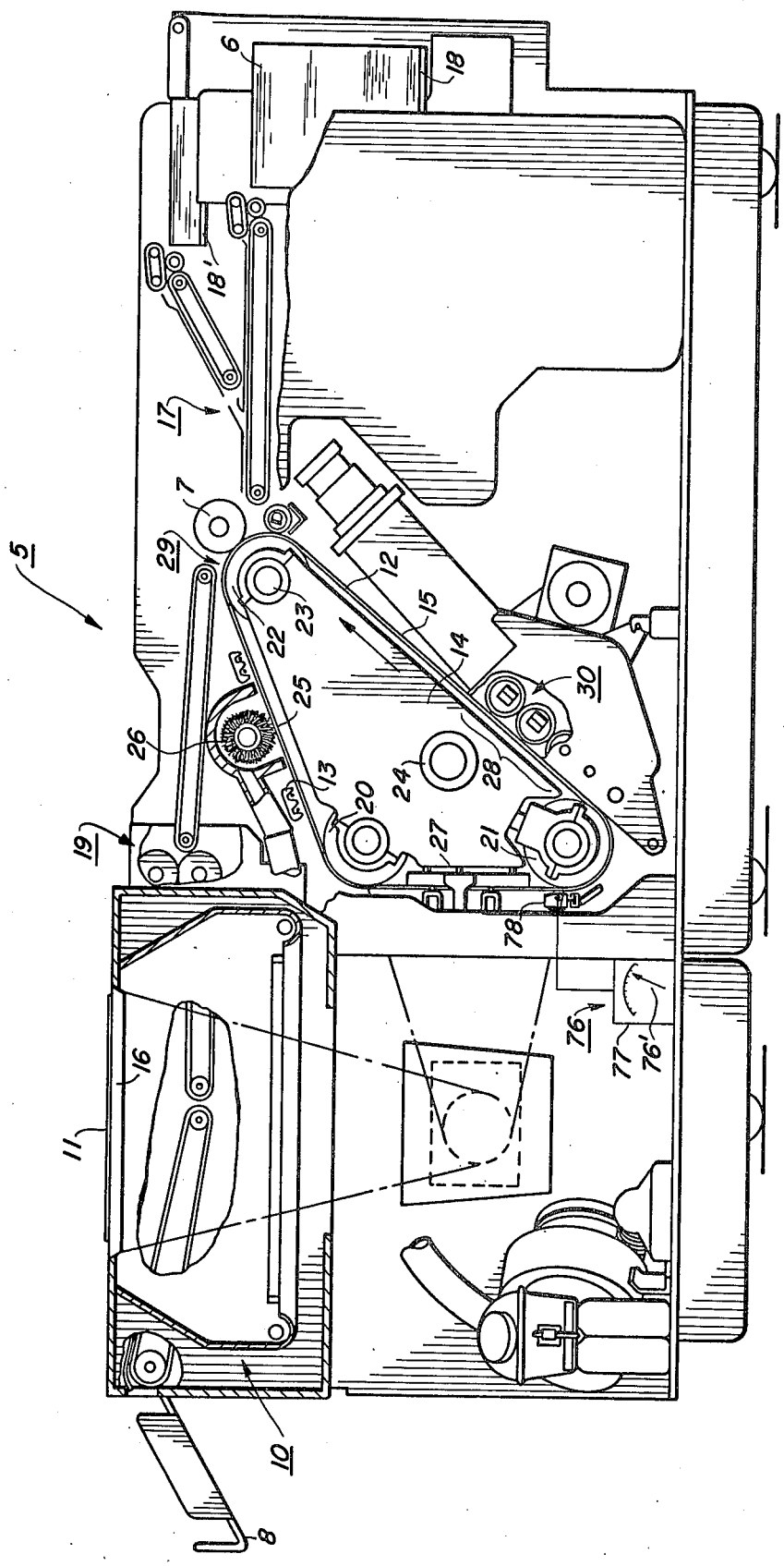
FIG. 1 is a schematic sectional view of an electrostatic reproduction machine incorporating the electrometer of the present invention.

For a general understanding of the invention, an exemplary copier/reproduction machine in which the invention may be incorporated, is shown in FIG. 1. The reproduction or copying machine, is there designated generally by the numeral 5.

A document 11 to be copied is placed upon a transparent support platen 16 fixedly arranged in an illumination assembly, generally indicated by the reference numeral 10, positioned at the left end of the machine 5. Light rays from illumination system are flashed upon the document to produce image rays corresponding to the information areas. The image rays are projected by means of an optical system onto the photosensitive surface of a xerographic plate in the form of a flexible photoconductive belt 12 arranged on a belt assembly, generally indicated by the reference numeral 14.

The belt 12 comprises a photoconductive layer 15 of selenium which is the light receiving surface and imaging medium for the apparatus, on a conductive backing. The surface of the photoconductive belt is made photosensitive by a previous step of uniformly charging the same by means of a corona generating device or corotron 13.

The belt is journaled for continuous movement upon three rollers 20, 21 and 22 positioned with their axes in parallel. The photoconductive belt assembly 14 is slidably mounted upon two support shafts 23 and 24, with the roller 22 rotatably supported on the shaft 23 which is secured to the frame of the apparatus and is rotatably driven by a suitable motor and drive assembly (not shown) in the direction of the arrow at a constant rate. During exposure of the belt 12, the reflected light image of such original document positioned on the platen is flashed on the surface 15 of belt 12 to produce an electrostatic latent image thereon at exposure station 27.

The electrostatic latent image on the moving belt 12 passes through a developing station 28 in which there is positioned a magnetic brush developing apparatus, generally indicated by the reference numeral 30, and which provides development of the electrostatic image by means of multiple brushes as the same moves through the development zone.

The developed electrostatic image is carried on belt 12 to transfer station 29 whereat a sheet 6 of copy paper is fed between transfer roller 7 and belt 12 at a speed in synchronism with the moving belt to transfer the developed image to sheet 6 without blurring. A sheet transport mechanism, generally indicated at 17, brings sheets 6 from paper supply tray 18 or 18' to the transfer station 29 at the proper time to match the arrival of the sheet with the arrival of the developed image on belt 12.

Following transfer, the image bearing sheet is separated from belt 12 and conveyed to a fuser assembly, generally indicated by the reference numeral 19, wherein the developed powder image on the sheet is permanently affixed thereto. After fusing, the finished copy is discharged from the apparatus into a suitable collector, i.e. tray 8. Residual toner particles and any other residue left on belt 12 are removed by brush 26 at cleaning station 25. Further details regarding the structure of the belt assembly 14 and its relationship with the machine and support therefor may be found in U.S. Pat. No. 3,730,623 issued May 1, 1973 and assigned to the same assignee.

To insure optimum machine performance, both initially and during the machine service life, adjustment or tuning of the various machine processing components, such as adjustment of the power input to the corona generating device 13, or adjustment of the voltage bias to the magnetic brush developing apparatus 30, etc. are made. These adjustments may be performed manually and are normally performed by the machine technical or service representative who conveniently employs an electrostatic voltage measuring device, commonly termed an electrometer, and designated herein by the numeral 76. Electrometer 76, which consists of a main body 77 and probe section 78 operably interconnected by suitable electrical leads, measures the voltage or potential on a surface. In the present example, electrometer 76 measures the charge on the surface of belt 12. Electrometer 76 may include a meter 76' to indicate visually the voltage being read. Alternately, an automatic control may be provided wherein the output of the electrometer 76, reflecting the voltage level of the area measured, i.e., belt 12, is used to adjust the power input or bias to one or more of the machine process components.

Figure 2:
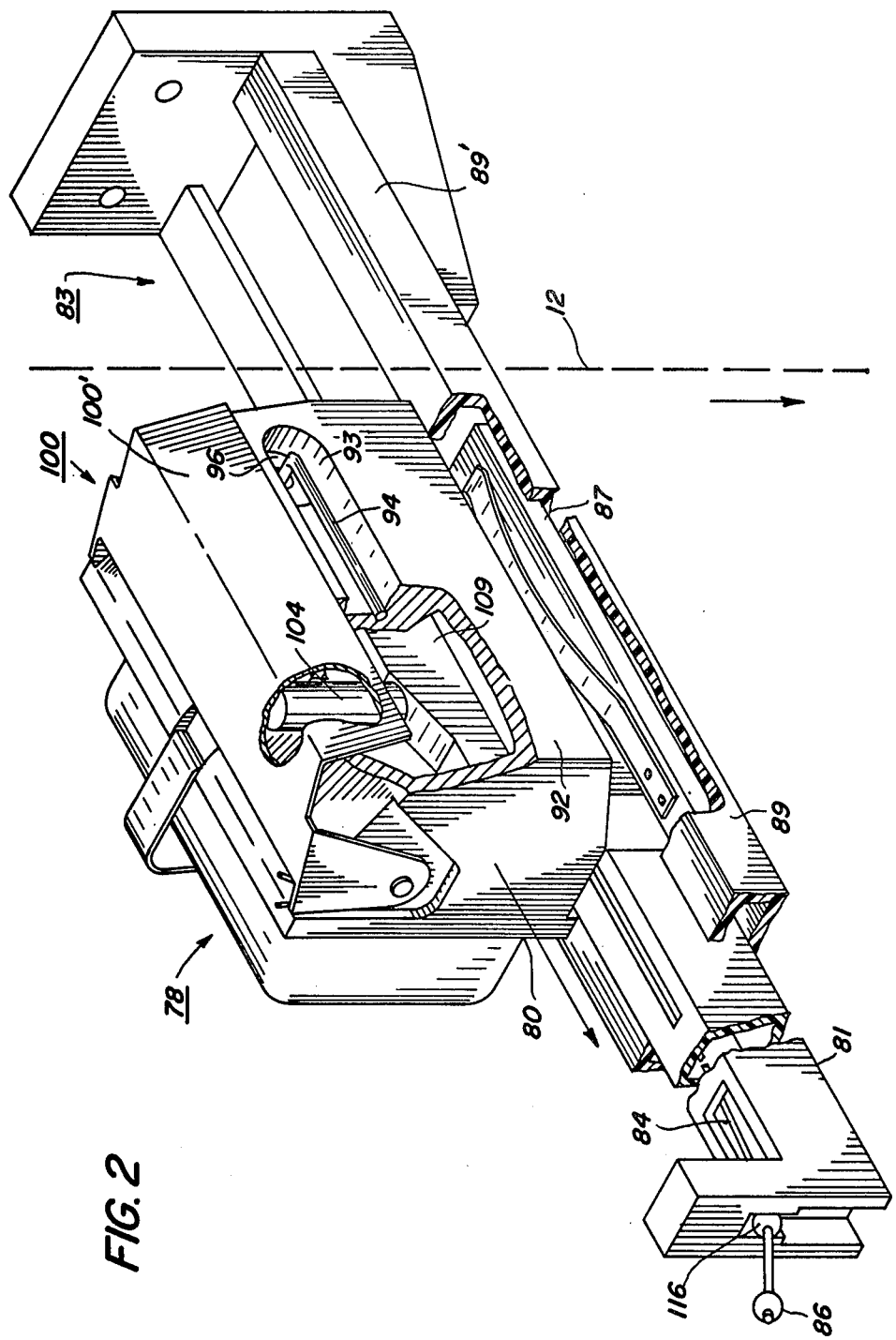
FIG. 2 is an isometric view showing details of a probe section and support therefore of an electrometer.

Referring to FIGS. 1 and 2, electrometer probe section 78 includes a substantially closed generally rectangularly shaped housing 80 mounted on an elongated arm 81. A portion of the electrometer circuit 200 shown in FIG. 3 may be conveniently disposed within the housing 80. Arm 81 is of sufficient length to permit the probe housing 80 to be moved laterally back and forth across belt 12 and to a probe storage position 83 outside the track of belt 12 when the electrometer 76 is not in use. Arm 81 which is hollow, houses a cable 84 for operating the probe shutter 100. A knob 86, which is coupled to cable 84, is provided to operate cable 84 and open and close shutter 100.

Arm 81 includes a pair of outwardly projecting supports 87 on either side slidably received in a complementarily configured track member 89 attached to machine 5 and projecting substantially transversely to belt 12. The length of track member 89 is such that member 89 extends across the width of belt 12 and for a distance therebeyond, the latter segment 89' of member 89 comprising the nonoperative storage position 83 for the probe section 78. Member 89 is preferably formed from metal and grounded to the frame of machine 5. To preclude shorting of probe 78 to ground through track member 89, supports 87 are preferably formed from an electrical insulating material such as plastic.

In the exemplary arrangement shown, track member 89 is disposed below and under the optical field of exposure station 27. In this disposition, electrometer 76 can be used to measure the effective charge placed on the photoconductive surface 15 of belt 12 both before and after exposure has taken place. Other dispositions of track member 89 and the electrometer probe section 78 may be envisioned.

Figure 3:
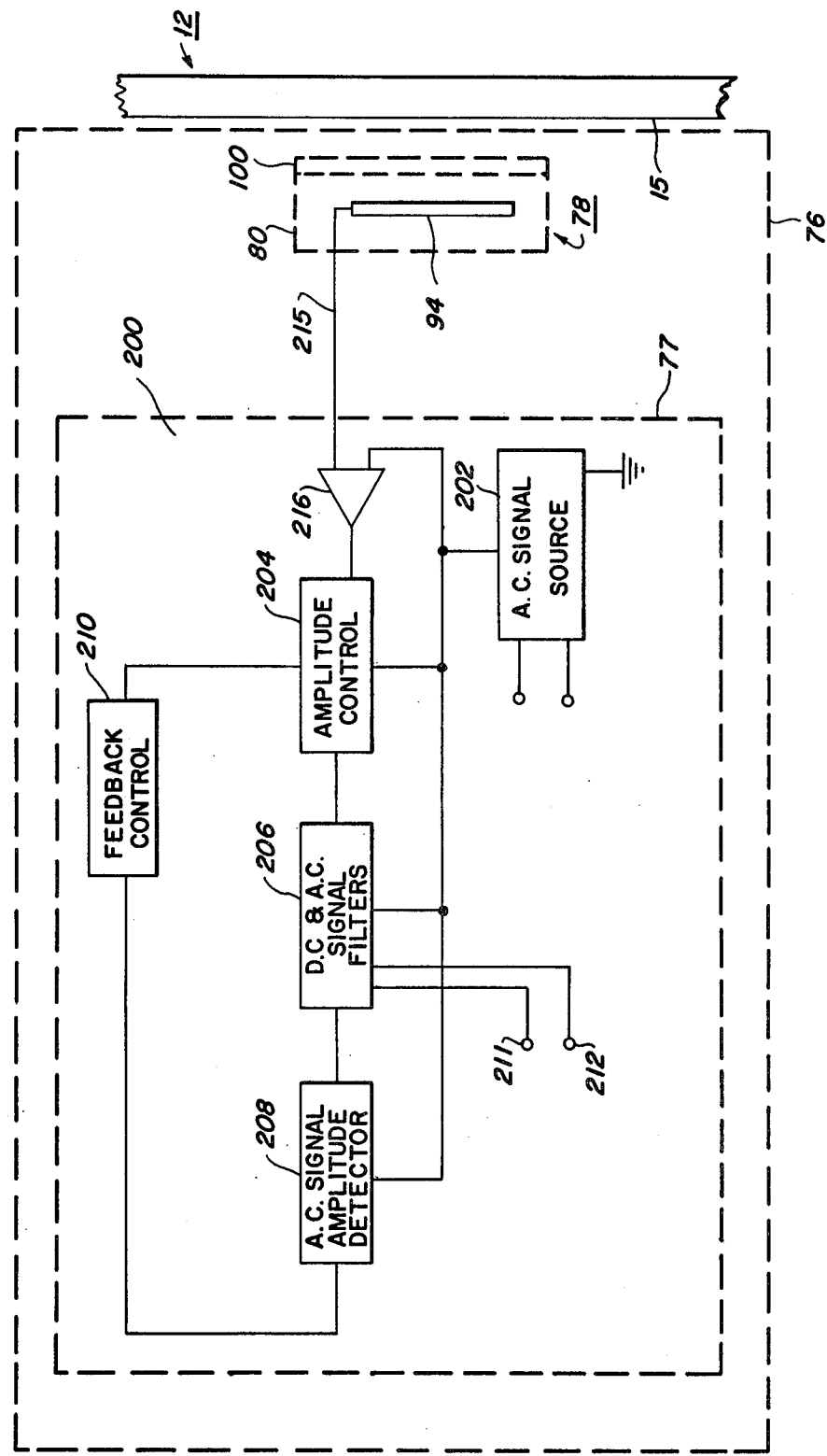
FIG. 3 is a block diagram showing the automatic distance compensating control of the present invention.

Referring now to FIGS. 1, 2, and 3, a wire-like probe 94 is disposed within housing 80 opposite an aperture 93 facing belt 12. Probe 94 is electrically connected to circuit 200 by lead 215. Insulator 96 serves to maintain the probe 94 electrically isolated from housing 80. Side 92 of housing 90 and face 100' of shutter 100 cooperate to provide a surface area which tends to eliminate or at least reduce coupling between probe 94 and adjoining surfaces such as track member 89. Probe housing 80 and shutter 100 are therefore preferably formed from a suitable conductive material such as metal.

Shutter 100 which serves to shield probe 94 from belt 12 during non-use of electrometer 76 or when calibrating the electrometer 76, is pivotally supported on housing 80 for movement into and out of covering relationship with aperture 93. Shutter 100 is coupled to cable 84 through cooperating shutter drive pin 104 and cam 109, cam 109 being supported for slidable movement back and forth within the hollow arm 81 and connected to cable 84. Actuation of handle 86 works through cable 84 and cam 109 to raise pin 104 and open shutter 100. Suitable spring means are provided to close shutter 100 and withdraw cable 84. Lock 116 permits cable 84 to be releasably locked with shutter 100 raised and aperture 93 open.

Referring now to FIG. 3, the electrometer circuit 200 is thereshown in block form. Circuit 200 includes a.c. signal source 202, scaling or amplitude control 204, d.c. and a.c. signal filters 206, a.c. signal amplitude detector 208, feedback control 210 and buffer amplifier 216. In the exemplary arrangement shown, the d.c. signal output of electrometer 76, which is a measure of the voltage potential on the surface being measured, i.e. photoconductive surface 15 of belt 12, appears across input leads 211, 212 of meter 76' (FIG. 4).

Figure 4:
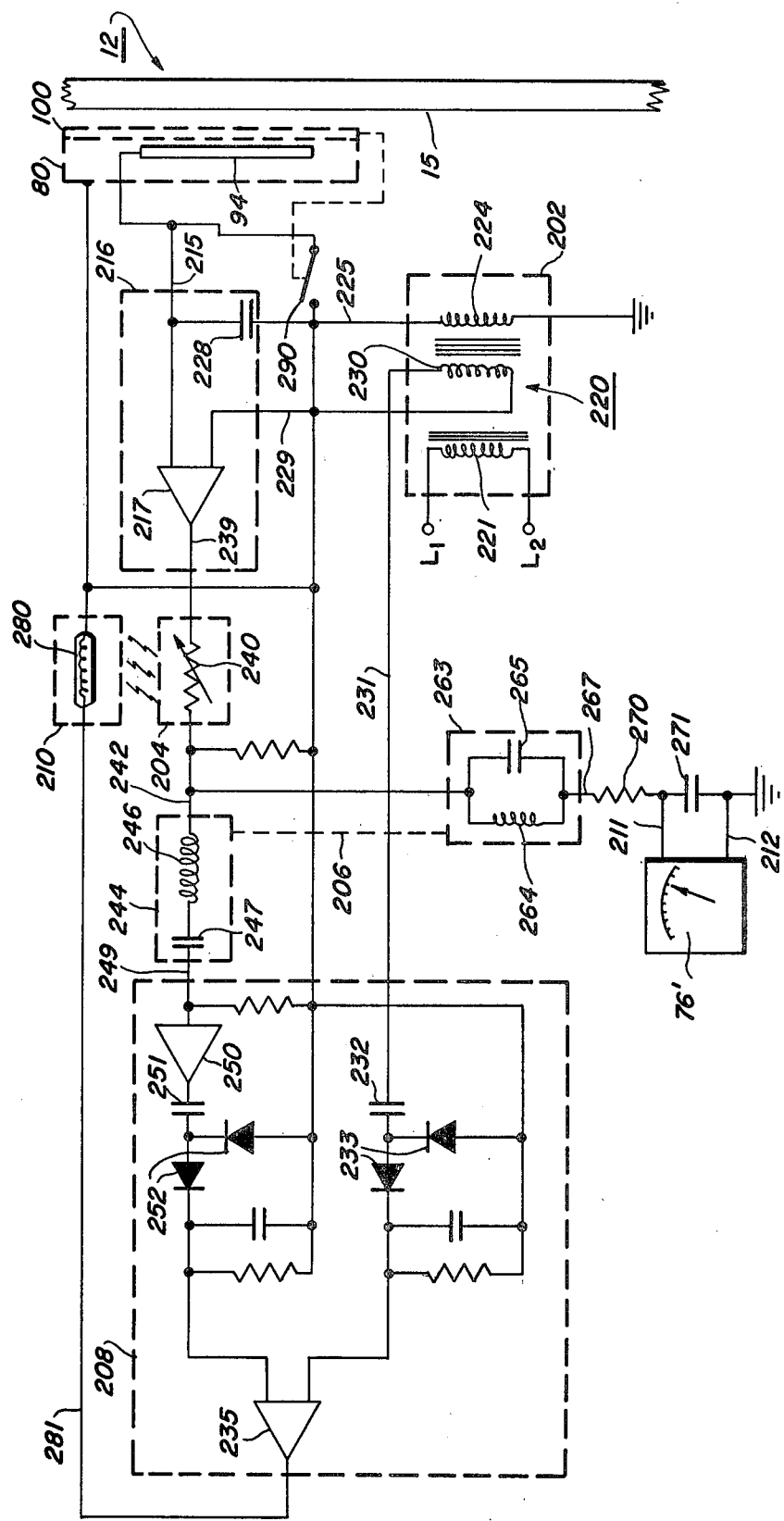
FIG. 4 is a schematic of the automatic distance compensating control circuit of the present invention.

Referring particularly to FIG. 4 of the drawings, the d.c. signal output of probe 94 in probe output lead 215 is inputted to one gate of operational amplifier 217 of buffer amplifier 216. A.C. signal source 202 includes a suitable transformer 220, the input or primary winding 221 of which is coupled to a suitable a.c. input, represented by leads $L_1$, $L_2$. Secondary winding 224 of transformer 220 provides, in common lead 225, an a.c. signal source of known intensity which is imposed onto the d.c. signal output of probe 94 appearing in probe output lead 215 through capacitor 228 of buffer amplifier 216. Lead 229 couples lead 225 with a second input gate of operational amplifier 217. Winding 230 of transformer 220 provides an a.c. reference signal which is rectified and inputted to operational amplifier 235 of a.c. signal amplitude detector 208 via lead 231. Capacitor 232, and diodes 233 in lead 231 serve to eliminate the d.c. signal component and rectify the a.c. signal component to provide a d.c. signal proportional in amplitude to the a.c. signal component.

The combined d.c./a.c. signal output of amplifier 216 appears in amplifier output lead 239. Lead 239 couples amplifier 216 with signal filters 206 through light responsive variable resistor 240 of amplitude control 204. As will be understood by those skilled in the art, resistor 240 comprises a resistance element, the resistance value of which varies in response to the degree of illumination to which the resistance element is exposed. Variations in the resistive value of resistor 240 effects a corresponding change in the amplitude of the combined a.c./d.c. signal in lead 239, increased resistance increasing the voltage drop across resistor 240 with decreased resistance reducing the voltage drop.

D.C. and a.c. signal filters 206 comprise both a low impedance filter section 244, consisting of series coupled coil 246 and capacitor 247 for filtering out or blocking the d.c. components and spurious a.c. of the combined d.c./a.c. signal in lead 239 and a high impedence filter section 263 consisting of coil 264 and capacitor 265 coupled in parallel for filtering or blocking out the a.c. components of the combined d.c./a.c. signal. The output of low impedance filter section 244 is conducted by lead 249 to amplifier 250. The a.c. output of amplifier 250 is conducted by capacitor 251, rectified by diodes 252 and applied to a second input gate of operational amplifier 235. The d.c. output of the high impedence filter section 263, which reflects the charge potential on the portion or segment of the photosensitive surface 215 of belt 12 being viewed by probe 94 is conducted by lead 267, resistor 270 and capacitor 271 to ground. As will be understood, the charge on capacitor 271 corresponds to the potential of the d.c. signal in lead 267 which is a measure of the voltage potential on surface 15. Output leads 211, 212 are connected across capacitor 271 to enable the value of the voltage potential to be read by meter 76'. Meter 76' may comprise any suitable meter such as a voltmeter.

The output of amplifier 235 of amplitude detector 208 in lead 281 of amplifier 235 drives a variable intensity lamp 280 of feedback control 210. Lamp 280 may comprise a suitable lamp such as a light emitting diode (L.E.D). Lamp 280 is optically coupled to the light responsive variable resistor 240. As will be understood, the illumination intensity produced by lamp 280 is proportional to the strength of the signal in lead 281. Common lead 225 is coupled with housing 80 and shutter 100 of the probe assembly 78. Switch 290 which is drivingly coupled to shutter 100 so as to close upon closure of shutter 100 serves to discharge capacitor 228 whenever shutter 100 is closed to thereby zero the electrometer input.

In operation, a stable a.c. signal of known value is imposed on the common lead 225, the signal being obtained from a.c. signal source 202. In addition, the probe housing 80 and shutter 100 are biased by the a.c. signal. The combined d.c./a.c. signal in the probe lead 215 and output lead 239 of buffer amplifier 216 passes through variable resistor 240 to the a.c. and d.c. filters 244, 263 respectively, resistor 240 imposing a voltage drop on the combined d.c./a.c. signal proportional to the degree of illumination to which resistor 240 is subjected by lamp 280. The illumination intensity of lamp 280 is proportional to the signal output of feedback control 210.

The a.c. component of the combined d.c./a.c. signal output of amplifier 216 is inputted to amplifier 235 of a.c. signal amplitude detector 208 and there compared with the a.c. reference signal from winding 230 of transformer 220. So long as the amplitudes of the signal inputs to amplifier 235 remain unchanged, the signal output of amplifier 235 to feedback control 210 remains constant and lamp 280 produces a predetermined illumination. Under these circumstances, the resistance value of resistor 240 which is preset, remains unchanged. The output of probe 84, reflecting the voltage potential on the photoconductive surface 15 appears across leads 211, 212 and is read on meter 76'.

Should the amplitude of the a.c. signal in lead 249 change, indicating a change in spacing between probe 94 and the photoconductive surface 15, the strength of the feedback signal in lead 281 to lamp 280 undergoes a corresponding adjustment. This changes the illumination intensity of lamp 280 with resultant change in the resistance value of resistor 240. The change in value of resistor 240 effects a corresponding change in the amplitudes of both the d.c. and a.c. components of the signal in lead 242.

While the invention has been described with reference to the structure disclosed, it is not confined to the details set forth, but is intended to cover such modifications or changes as may come within the scope of the following claims.

What is claimed is:

1. In an electrostatic type voltmeter for measuring the potential on a surface, the voltmeter including a probe, a housing for said probe, and support means for supporting said probe together with said probe housing in spaced relationship with said surface, the probe producing a d.c. output signal reflecting the potential of said surface, the combination of:
   means for generating an a.c. bias signal
   means for applying said bias signal to said probe housing and for combining said bias signal with the output signal of said probe to produce a combined a.c./d.c. signal;
   means for generating an a.c. reference signal; and
   amplitude adjusting means for regulating the signal amplitude of said combined a.c./d.c. signal in response to a change in the amplitude of the a.c. component of said combined a.c./d.c. signal relative to said a.c. reference signal to maintain a preset relationship between the a.c. component of said combined a.c./d.c. signal and said a.c. signal whereby to compensate said probe output signal for a change in spacing between said probe and said surface.

2. The voltmeter according to claim 1 including filtering means for separating said a.c. signal component from said combined a.c./d.c. signal for comparison with said a.c. reference signal.

3. The voltmeter according to claim 2 in which said amplitude adjusting means includes comparator means for comparing said a.c. signal component with said a.c. reference signal.

4. In an electrostatic type reproduction machine for producing copies of an original, the machine having a photoreceptor, means for charging the photoreceptor in preparation for imaging, exposure means for exposing the charged photoreceptor to the original whereby to create a latent electrostatic image of the original on the photoreceptor, developing means for developing the latent electrostatic image on the photoreceptor, and transfer means for transferring the developed image to a sheet of copy material, the combination comprising:
   means for generating a d.c. signal representing the charge on said photoreceptor;
   means for combining said d.c. signal with an a.c. signal to provide a combined a.c./d.c. signal;
   means for controlling the amplitude of said combined a.c./d.c. signal;
   filtering means to separate said combined signal into a.c. and d.c. signal components;
   means for comparing said separated a.c. signal with an a.c. control signal of predetermined amplitude; and
   means responsive to the difference in amplitude between said separated a.c. signal and said control signal to actuate said amplitude controlling means and change the amplitude of said combined a.c./d.c. signal to correlate said separated a.c. signal with said control signal.

5. In an electrostatic type reproduction machine for producing copies of an original, the machine having a photoreceptor, means for charging the photoreceptor in preparation for imaging, exposure means for exposing the charged photoreceptor to the original whereby to create a latent electrostatic image of the original on the photoreceptor, developing means for developing the latent electrostatic image on the photoreceptor, and transfer means for transferring the developed image to a sheet of copy material, the combination comprising:
   d.c. electrometer means for measuring charge potentials on said photoreceptor, said electrometer means including a measuring probe disposed in spaced relationship with said photoreceptor, said electrometer means producing a d.c. input signal representative of the charge potential on the portion of the photoreceptor adjacent said probe;

an a.c. signal source for generating an a.c. input signal of predetermined amplitude;

means for combining said d.c. input signal with said a.c. input signal to provide a combined a.c./d.c. signal;

control means for varying the amplitude of said combined a.c./d.c. signal;

filtering means for separating said a.c./d.c. signal to provide a separated a.c. output signal and a separated d.c. output signal representative of said photoreceptor charge; and amplitude detecting means for detecting changes in the amplitude of said a.c. output signal, said detecting means being effective on a change in amplitude of said a.c. output signal to actuate said control means to change the amplitude of said a.c./d.c. signal to provide an a.c. output signal having an amplitude substantially equal to the amplitude of said a.c. input signal whereby to correct for changes in spacing between said probe and said photoreceptor.

6. The method of operating an electrostatic type reproduction machine for producing copies of an original, the machine having a photoreceptor, means for charging the photoreceptor in preparation for imaging, exposure means for exposing the charged photoreceptor to the original whereby to create a latent electrostatic image of the original on the photoreceptor, developing means for developing the latent electrostatic image on the photoreceptor, and transfer means for transferring the developed image to a sheet of copy material, the steps consisting of:

generating a d.c. signal representing the charge on said photoreceptor combining said d.c. signal with an a.c. signal to provide a combined a.c./d.c. signal separating said combined signal into a.c. and d.c. signal components comparing said separated a.c. signal with an a.c. control signal of predetermined amplitude; and controlling the amplitude of said combined a.c./d.c. signal to maintain a preset relationship between said separated a.c. signal and said a.c. control signal.

* * * * *